United States Patent [19]

Nielsen

[11] Patent Number: 5,692,010
[45] Date of Patent: Nov. 25, 1997

[54] ADAPTIVE EQUALIZER WITH IMPULSE NOISE PROTECTION

[75] Inventor: Larry E. Nielsen, Chicago, Ill.

[73] Assignee: Zenith Electronics Corporation, Glenview, Ill.

[21] Appl. No.: 583,733

[22] Filed: Jan. 17, 1996

[51] Int. Cl.[6] .......................... H03K 5/1252; H04N 5/44
[52] U.S. Cl. .......................................... 375/232; 348/725
[58] Field of Search .................................. 375/286, 287, 375/231, 232, 316, 346, 348, 350; 364/724.19, 724.2; 348/725, 729

[56] References Cited

U.S. PATENT DOCUMENTS

| | | | |
|---|---|---|---|
| 4,858,235 | 8/1989 | Matsuda et al. | 371/38 |
| 4,907,248 | 3/1990 | Bretl | 375/244 |
| 5,168,246 | 12/1992 | Pulluru et al. | 331/8 |
| 5,235,424 | 8/1993 | Wagner et al. | 358/174 |
| 5,414,571 | 5/1995 | Matsushige et al. | 375/232 X |
| 5,455,813 | 10/1995 | Hayashi | 369/59 |
| 5,499,268 | 3/1996 | Takahashi | 375/231 |
| 5,502,507 | 3/1996 | Kim | 348/607 |
| 5,524,023 | 6/1996 | Tsujimoto | 375/232 |
| 5,528,627 | 6/1996 | Yanagi et al. | 375/232 |
| 5,581,585 | 12/1996 | Takatori et al. | 375/376 |

*Primary Examiner*—Young T. Tse

[57] ABSTRACT

A digital receiver receives a multi level symbol signal that includes a frame sync. An equalizer is supplied with the signal and corrects for errors that are determined to exist therein on the basis of comparing the frame sync with a known value thereof or comparing the average level of the multi level symbols to an estimated (known) value thereof. A threshold circuit is included for rejecting impulse noise in the error signal that exceeds a threshold level that is higher than the maximum symbol level in the symbol.

2 Claims, 2 Drawing Sheets

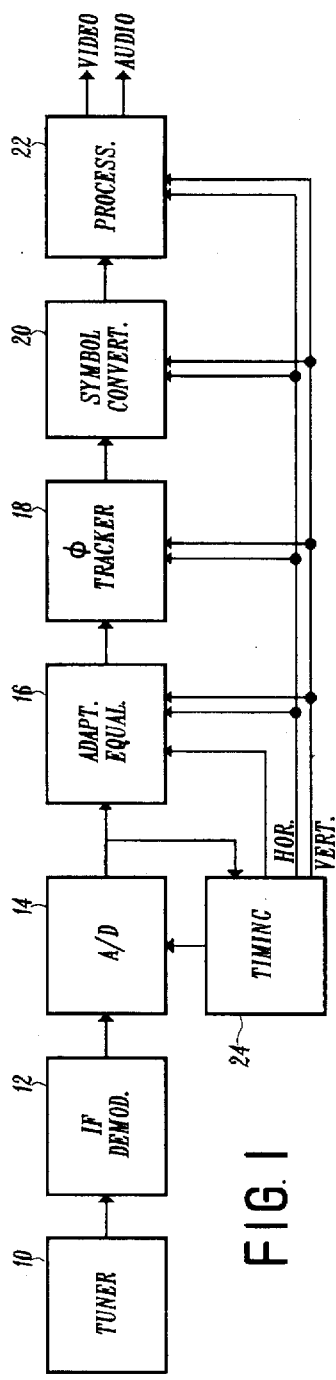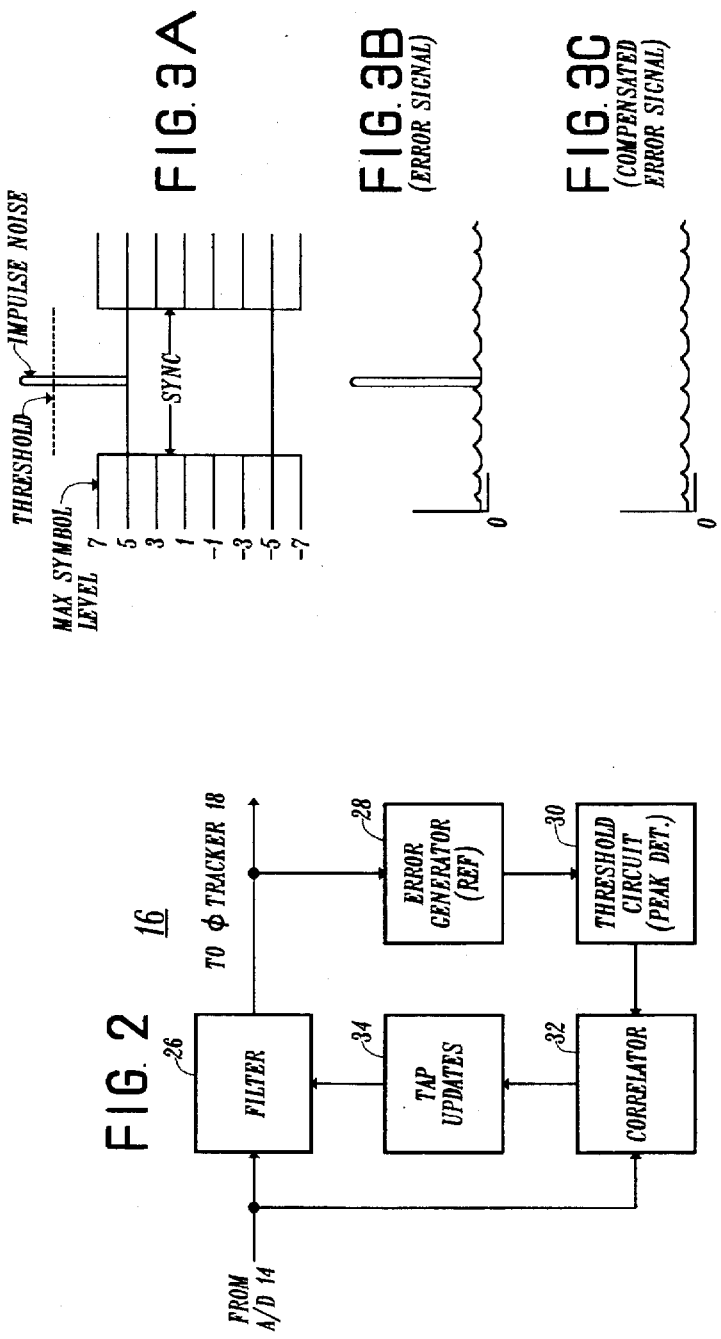

ADAPTIVE EQUALIZER WITH IMPULSE NOISE PROTECTION

BACKGROUND OF THE INVENTION AND PRIOR ART

This invention relates generally to equalizers and in particular to adaptive equalizers that are used to compensate received digital signals for transmission impairments. The preferred embodiment of the invention comprises a digital ATV (advanced television) signal, transmitted as a series of multi level symbols that includes a two level frame sync which may also serve as a training sequence.

Equalizers are well known in the art. Adaptive equalizers for digital signals are relatively new and generally include a multi tapped digital filter through which the signal is passed. The filter taps are periodically updated based upon error signals that are developed by comparing the received input signal with a known training sequence (or other known signal). It is also known to slice the random data levels to generate an estimate of the transmitted signal rather than simply use a known training sequence. The invention applies to both arrangements. A tap update algorithm controls the updating of the taps. The digital filter design and the tap update algorithm involve compromises between speed of response of the equalizer and its ability to track moving ghost signals. Such systems are at a disadvantage in the presence of non linear channel impairments, e.g. impulse noise that affect the received signal.

OBJECTS OF THE INVENTION

A principal object of the invention is to provide an improved adaptive equalizer for a digital signal.

Another object of the invention is to provide an equalizer that compensates for impulse noise in the received signal.

BRIEF DESCRIPTION OF THE DRAWINGS

These and other objects and advantages of the invention will be apparent upon reading the following description in conjunction with the drawings, in which:

FIG. 1 is a partial block diagram of a receiver constructed in accordance with the invention;

FIG. 2 is a partial block diagram of the adaptive equalizer of the receiver of FIG. 1;

FIGS. 3A, 3B and 3C illustrate impulse noise and its elimination in the error signal as taught by the invention.

DESCRIPTION OF THE PREFERRED EMBODIMENT

Figure 4:
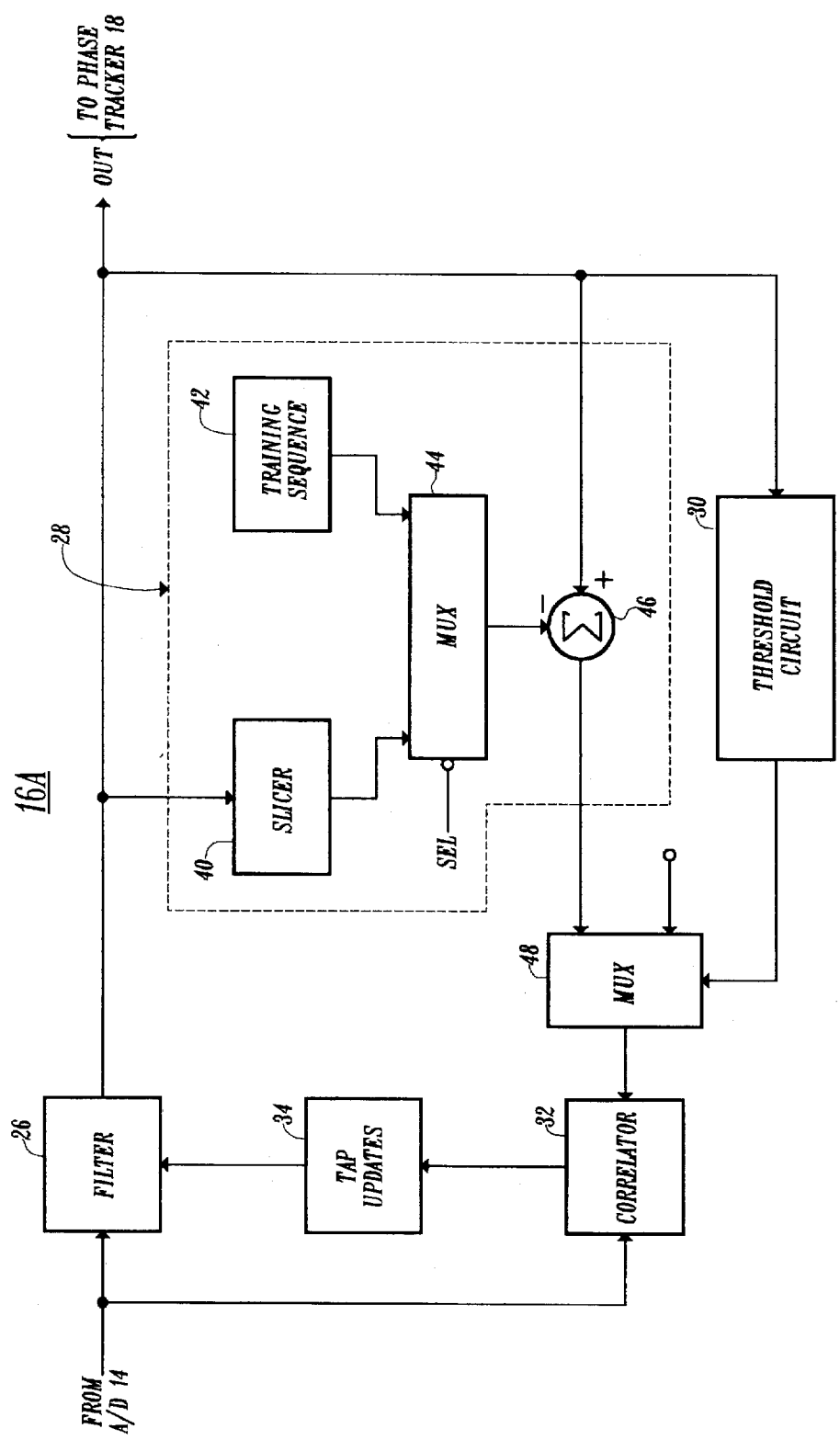
FIG. 4 illustrates a system that slices data or uses a training sequence for equalization.

In FIG. 1, a tuner 10 receives a multi level symbol digital signal, either terrestrially, i.e. over the air, or via cable and supplies it to an IF demodulator 12 where the signal is processed in accordance with well known techniques to develop an IF (intermediate frequency) signal. The developed IF signal is supplied to an A/D converter 14 where it is converted to a series of corresponding symbol levels. An adaptive equalizer 16 receives the signal from the A/D converter 14, equalizes it (as will be described) and supplies it to a phase tracker 18 that may operate, for example, in accordance with U.S. Pat. No. 5,406,587. The phase tracker 18 supplies a symbol converter 20 that converts the received signal into corresponding digital data in byte (or word) form and applies it to a processing block 22 where the video and audio are ultimately recovered. The processing block 22 may incorporate deinterleaving circuitry, forward error correction circuitry and derandomizing circuitry, depending upon the type of encoding that the received signal was subjected to at the transmitter. Such details are omitted from this description since they have no bearing on the present invention. A timing circuit 24 is also supplied from A/D circuit 14 and develops suitable timing signals for controlling the A/D converter 14 and the adaptive equalizer 16. Timing circuit 24 also develops horizontal and vertical sync signals that are applied to adaptive equalizer 16, phase tracker 18, symbol converter 20 and processing circuit 22.

In FIG. 2, the adaptive equalizer circuit 16 is expanded upon and is further seen to include a digital filter 26 that supplies an output signal to phase tracker 18 and to an error generator 28. The error generator 28 is of well known construction and develops an error signal by comparing the received training sequence, in this instance the frame sync, to a known value of the training sequence (frame sync). As will be seen in FIG. 4, a data slicing arrangement may also be used to generate an estimate of the transmitted signal (or correct received signal) for equalization. The output of the error generator 28 is supplied to a threshold circuit 30, the output of which is supplied to a first input of a correlator circuit 32. A/D circuit 14 supplies a second input of correlator circuit 32. The output of correlator circuit 32 is supplied to a tap update block 34 that operates to update the various taps (not shown) in digital filter 26. With the exception of the threshold circuit 30, the apparatus in FIG. 2 is well known.

In operation, the output of A/D 14 is applied to one input of correlator 32. Ignoring threshold circuit 30 for the moment, an error signal is developed in error generator 28 by comparing the recovered frame sync (or training sequence) with the known value of the frame sync (or training sequence) and is applied to the other input of correlator 32. Correlator 32 functions to sum a series of multiplications of the error signal and the input signal, to scale its output and to combine the old tap values of digital filter 26 with the output of the correlator to develop new tap values for filter 26. For channel impairments that are linear, the circuit will nullify the effects of such impairments in the output signal supplied to phase tracker 18. The speed at which this is accomplished depends upon the scale factor of the correlator.

The threshold circuit 30, which may be a peak detector, limits the effects of non linear impulse noise in the error signal developed by the error generator 28. As is seen in FIGS. 3A–3C, the frame sync is indicated as corresponding to intermediate levels of the data symbols with the maximum symbol level being shown. A threshold that is established above this maximum symbol level is indicated by the dashed line. This threshold is arbitrarily set based upon empirical data and the environment in which the system operates. An impulse noise spike is illustrated as rising above the threshold in FIG. 3A. The error signal shown in FIG. 3B contains the impulse noise spike, which is large relative to the remainder of the error signal. This greatly distorts the error signal and since it is a non linear impairment, i.e. one which does not recur in that signal location, it cannot be effectively equalized. The invention removes or nullifies any impulse noise that exceeds the threshold (FIG. 3A). This is illustrated in FIG. 3C, which represents the error signal at the output of the threshold circuit 30 (the input of correlator 32). By nulling out the impulse noise, the non linear impairment doesn't affect the tap updating of the filter. The few lost points in the tap update algorithm are more than compensated for by the elimination of the distortion effects of the impulse noise on the operation of the equalizer.

The embodiment of FIG. 4 illustrates operation of the adaptive equalizer 16A by slicing the random data signal from filter 26 or by use of a training sequence, as alluded to earlier. A slicer 40, which operates on the random data signal, and a training sequence source 42 both supply a multiplexer 44 which subtractively applies its output to an adder 46, the other input of which is supplied with the random data signal. Multiplexer 44 is operated by a select signal input to couple either the output of slicer 40 or the training sequence 42 output to adder 46. Threshold circuit 30 is also supplied with the random data signal from filter 26 and is used to control the operation of another multiplexer 48 that supplies either the output of adder 46 or a "0" value to correlator 32. Thus whenever an impulse spike exceeds the level set by threshold circuit 30, multiplexer 48 is operated to substitute a "0" value for the error value developed from adder 46, thus effectively nullifying the effects of the impulse noise on the error signal. In this manner, the effect of large impulse noise is overcome. It will be appreciated that this arrangement may be used with the threshold and correlator circuits of FIG. 4 with equal effect.

What has been described is a novel equalizer for a digital signal that has improved immunity to pulse noise impairments. It is recognized that numerous changes in the described embodiment of the invention will be apparent to those skilled in the art without departing from its true spirit and scope. The invention is to be limited only as defined in the claims.

What is claimed is:

1. A digital television receiver comprising:

means for receiving a multi level symbol signal;

means for developing an error signal indicative of impairments in said received multi level symbol signal;

means for compensating said error signal to nullify the effects of said impairments therein due to impulse noise;

means for supplying said compensated error signal for equalizing said received multi level symbol signal;

wherein said compensating means includes means for establishing a threshold for said received multi level symbol signal that is greater than the maximum symbol level in said received multi level symbol signal; and means for nulling the effects of said impulse noise exceeding said threshold in said error signal.

2. The receiver of claim 1 wherein said received multi level symbol signal includes a frame sync and wherein said developing means develops said error signal based upon comparing said frame sync with a known value thereof.

\* \* \* \* \*